United States Patent
Cioci

(10) Patent No.: US 8,717,085 B2
(45) Date of Patent: May 6, 2014

(54) POWER SAVING RESONANT GATE DRIVER AND RELATED METHOD

(75) Inventor: Marco Cioci, Pavia (IT)

(73) Assignee: International Rectifier Corporation, El Segundo, CA (US)

(*) Notice: Subject to any disclaimer, the term of this patent is extended or adjusted under 35 U.S.C. 154(b) by 139 days.

(21) Appl. No.: 13/219,297

(22) Filed: Aug. 26, 2011

(65) Prior Publication Data

US 2013/0049816 A1 Feb. 28, 2013

(51) Int. Cl.
*H03K 17/687* (2006.01)

(52) U.S. Cl.
USPC .......................... 327/434; 327/427

(58) Field of Classification Search
USPC .................................. 327/427–437
See application file for complete search history.

(56) References Cited

U.S. PATENT DOCUMENTS 5,325,258 A * 6/1994 Choi et al. .................. 361/87

OTHER PUBLICATIONS

Y. Chen, "Resonant Gate Drive Techniques for Power MOSFETs", May 2000, pp. 1-85.

S. Pan et al., "A New Resonant Gate Driver with Two Half Bridge Structures for Both Top Switch and Bottom Switch", 2007, pp. 742-747.

W. Eberle et al., "A Resonant Gate Drive Circuit with Reduced MOSFET Switching and Gate Losses", 2006, pp. 1745-1750.

* cited by examiner

*Primary Examiner* — Lincoln Donovan
*Assistant Examiner* — Diana J Cheng
(74) *Attorney, Agent, or Firm* — Farjami & Farjami LLP

(57) ABSTRACT

According to one embodiment, a resonant gate driver comprises a resonant path configured to couple a gate of a power transistor to a supply capacitor, and a low impedance path configured to couple the gate of the power transistor to a voltage rail. The resonant gate driver selectively utilizes the resonant path during charging and discharging of the gate, and selectively utilizes the low impedance path to couple the gate to the voltage rail when the gate is neither charging nor discharging. A method for use by the resonant gate driver for driving the power transistor comprises charging and discharging the gate of the power transistor by selectively coupling the gate to a supply capacitor through a resonant path, and utilizing a low impedance path to selectively couple the gate to a voltage rail when the gate is neither charging nor discharging.

15 Claims, 5 Drawing Sheets

POWER SAVING RESONANT GATE DRIVER AND RELATED METHOD

BACKGROUND OF THE INVENTION

1. Field of the Invention

The present invention is generally in the field of electrical circuits and systems. More specifically, the present invention is in the field of driver circuitry utilized in driving power semiconductor devices.

2. Background Art

Gate driver circuitry is implemented in a wide variety of electronic circuits and systems. For example, gate drivers are typically utilized in a switching power converter to control the operation of high side and low side power switches, such as power insulated gate bipolar transistors (IGBTs), or power metal-oxide-semiconductor field-effect transistors (MOSFETs), for example, by charging and discharging the gate capacitance of those power switching devices.

As is well known, energy accumulates in the gate capacitance of a switching is device in the process of switching the device ON, and that energy is subsequently discharged from the gate in the course of switching the device OFF. In a conventional gate driver, the gate driver supply voltage is typically used to charge the switching device gate through a resistive path present due to the internal resistance of the gate driver circuitry in series with an external resistor. As a result, power is dissipated through this resistive path each time the gate is charged. In addition, the energy stored in the gate capacitance is dissipated through the resistive path each time the gate is discharged.

As advances in technology require operation at ever higher switching frequencies, the power loss due to charging and discharging of the switching device gate becomes increasingly problematic. For example, at a switching frequency of approximately 10 kHz, the power loss associated with charging and discharging a single switch may by approximately 1.5 W. Moreover, at higher frequencies, and/or when the switching device die size is increased to reduce conduction losses, thereby increasing the gate capacitance, power loss through the charge and discharge process may increase to several watts.

Thus, there is a need to overcome the drawbacks and deficiencies in the conventional art by providing a gate driver configured to substantially eliminate or significantly reduce power loss during charging and discharging of a power transistor gate.

SUMMARY OF THE INVENTION

The present invention is directed to a power saving resonant gate driver and related method, substantially as shown in and/or described in connection with at least one of the figures, and as set forth more completely in the claims.

DETAILED DESCRIPTION OF THE INVENTION

Figure 1A:
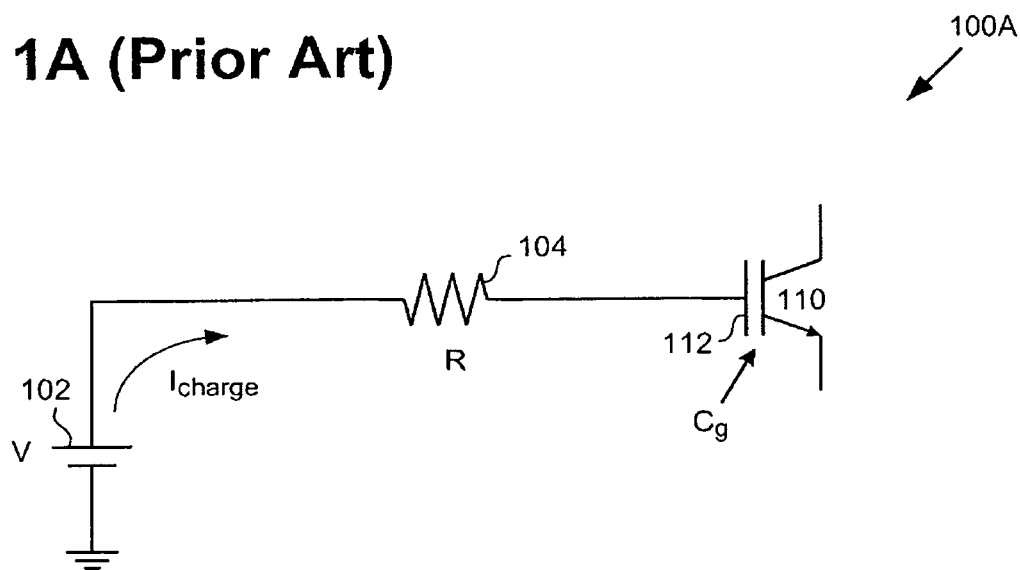
FIG. 1A shows a conceptual diagram depicting a conventional approach to charging a power transistor gate.

The present invention is directed to a power saving resonant gate driver and related method. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

FIG. 1A shows a conceptual diagram depicting a conventional approach to charging a power transistor gate. Conventional gate charging circuit 100A comprises battery 102 coupled to gate 112 of power transistor 110 through resistive path 104 (a "resistive path," such as resistive path 104, may also be referred to as a "resistance" in the present application, or be shown symbolically as a "resistor," and be referred to as such, in the present application). As shown in FIG. 1A, battery 102 supplies charging voltage V, while gate 112 is shown to have a gate capacitance $C_g$. As further shown in FIG. 1A, gate 112 of power transistor 110 is charged using current $I_{charge}$, which flows between battery 102 and gate 112 through resistance 104. Resistance 104, represented by resistor R, may be seen to correspond to the internal resistance of the circuitry provided to drive power transistor 110 (circuitry not shown in FIG. 1) in series with an external resistor coupled between battery 102 and gate 112.

Figure 1B:
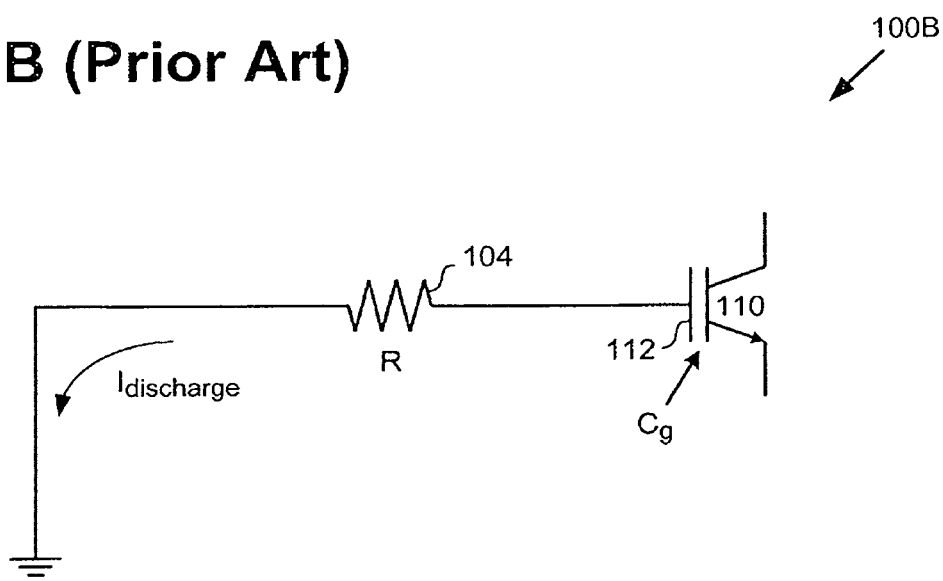
FIG. 1B shows a conceptual diagram depicting a conventional approach to discharging the power transistor gate shown in FIG. 1A.

FIG. 1B shows a conceptual diagram depicting a conventional approach to discharging gate 112 of power transistor 110. Conventional gate discharging circuit 100B shows the charge stored by gate capacitance $C_g$ being discharged by current $I_{discharge}$ through resistance 104. The conventional approach to gate charging and discharging represented in FIGS. 1A and 1B results in power being dissipated through resistance 104 during each charge/discharge cycle. Although the mathematical derivation is omitted from the present disclosure, it may be readily shown that the power dissipated during each charge/discharge cycle of gate 112 using the conventional gate driving approach is approximately equal to the product of the gate capacitance, supply voltage, and switching frequency:

$$P_{conventional\ loss} \approx C_g * V^2 * f \qquad \text{(equation 1);}$$

where f is the switching frequency of power transistor 110.

As is apparent from equation 1, power lost in charging and discharging gate 112 increases with increases in either or both of gate capacitance and switching frequency. However, advances in technology conspire to increase both of these parameters. For example, desirable switching frequencies for power transistor 110 move ever higher. In addition, attempts to reduce conduction loss in power transistor 110 may result in implementation of larger die sizes, which in turn has the tendency to increase gate capacitance. As a result, the losses flowing from the conventional approach to charge and discharge of gate 112 shown by FIGS. 1A and 1B grow ever more undesirable.

Figure 2:
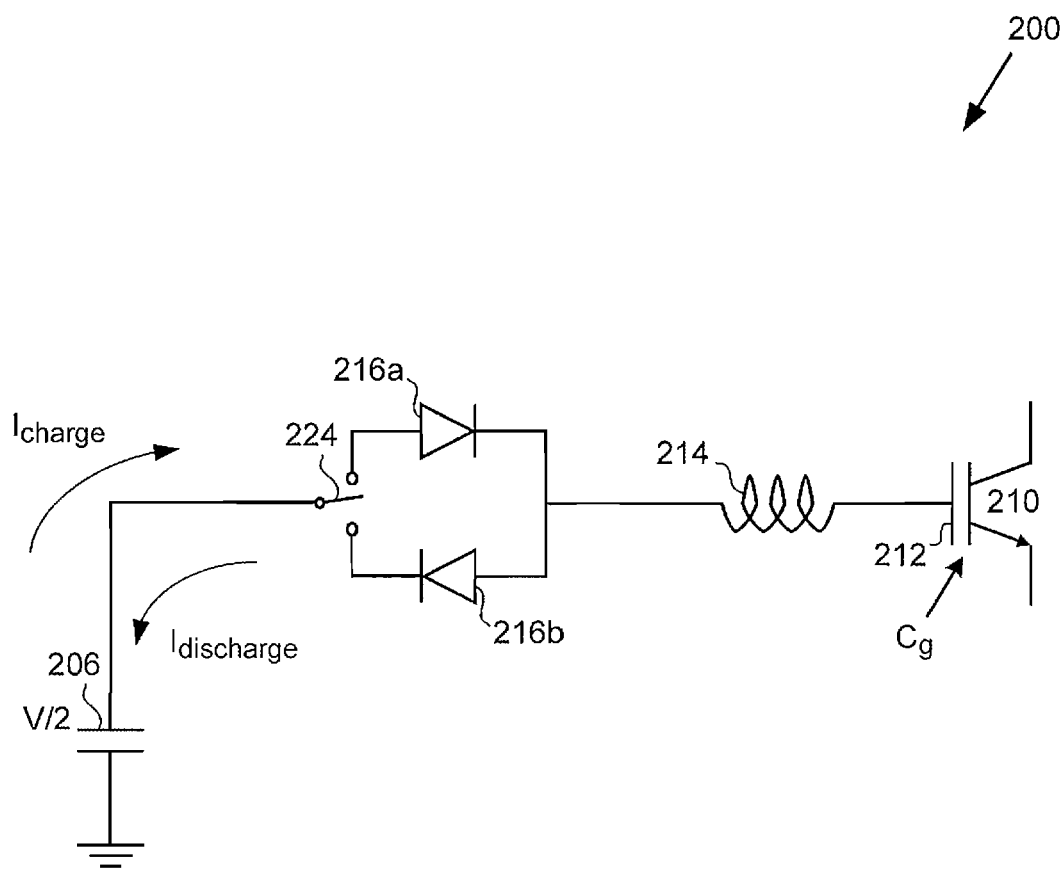
FIG. 2 shows a conceptual diagram depicting a process for resonantly charging and discharging a power transistor gate, according to one embodiment of the present invention.

FIG. 2 shows a conceptual diagram depicting a process for resonantly charging and discharging a power transistor gate, according to one embodiment of the present invention, capable of overcoming the drawbacks and deficiencies associated with the conventional approach shown by FIGS. 1A and 1B. Resonant gate driver arrangement 200, in FIG. 2, comprises supply capacitor 206 coupled to gate 212 of power transistor 210 through inductor 214 and anti-parallel charging/discharging diodes 216a and 216b. As shown in FIG. 2, supply capacitor 206 provides charging voltage V/2, while gate 212 is shown to have a gate capacitance $C_g$. For purposes of comparison, power transistor 210 having gate capacitance $C_g$ may correspond to power transistor 110 having substantially the same gate capacitance $C_g$, in FIGS. 1A and 1B, while voltage V/2 provided by supply capacitor 206, in FIG. 2, may be seen to equal approximately one half of voltage V supplied by battery 102, in FIG. 1A. Moreover, a switching frequency f characterizing the operation of power transistor 210 may be assumed for comparative purposes to substantially equal the switching frequency f previously attributed to power transistor 110.

It is noted that although power transistor 210 is represented in FIG. 2 as an insulated gate bipolar junction transistor (IGBT), that characterization is provided merely as an example. In other embodiments, the present inventive principles may be applied to provide a resonant driver for driving a power transistor implemented as a metal-oxide-semiconductor FET (MOSFET) or any other type of metal-insulator-semiconductor FET (MISFET).

As may be apparent from FIG. 2, gate 212 of power transistor 210 is charged using current $I_{charge}$, which flows between supply capacitor 206 and gate 212 through switch 224, charging diode 216a, and inductor 214. Correspondingly, gate 212 is discharged using current $I_{discharge}$ flowing between gate 212 and supply capacitor 206 through inductor 214, discharging diode 216b, and switch 224. Unlike the conventional implementation shown in FIGS. 1A and 1B, the conceptual embodiment of the present invention shown in FIG. 2 advantageously enables substantially lossless charge and discharge of gate 212.

Although, again, the full mathematical derivation of power dissipation is omitted from the present disclosure so as not to obscure the advantageous results achieved through application of the present inventive principles, it is a straightforward calculation to show that:

$$P_{resonant\ loss} \approx \alpha \pi/4 * C_g * V^2 * f \quad \text{(equation 2)};$$

where $\alpha \ll 1$. Consequently, the product $\alpha\pi/4$ is also necessarily much much less than 1.

Equations 1 and 2 permit a comparison between the power dissipation during each charge/discharge cycle for the inventive embodiment of FIG. 2, and that dissipated through use of the conventional approach shown by FIGS. 1A and 1B:

$$P_{resonant\ loss}: P_{conventional\ loss} \approx \alpha\pi/4 * C_g * V^2 * f : C_g V^2 f = \alpha\pi/4 \ll 1 \quad \text{(equation 3)}$$

Thus, as shown by equation 3, depending upon the particular operational environment in which the inventive principles represented by the embodiment of FIG. 2 is implemented, the present approach to resonantly charging and discharging gate 212 of power transistor 210 can significantly reduce or substantially eliminate the power losses associated with each charge/discharge cycle.

Figure 3:
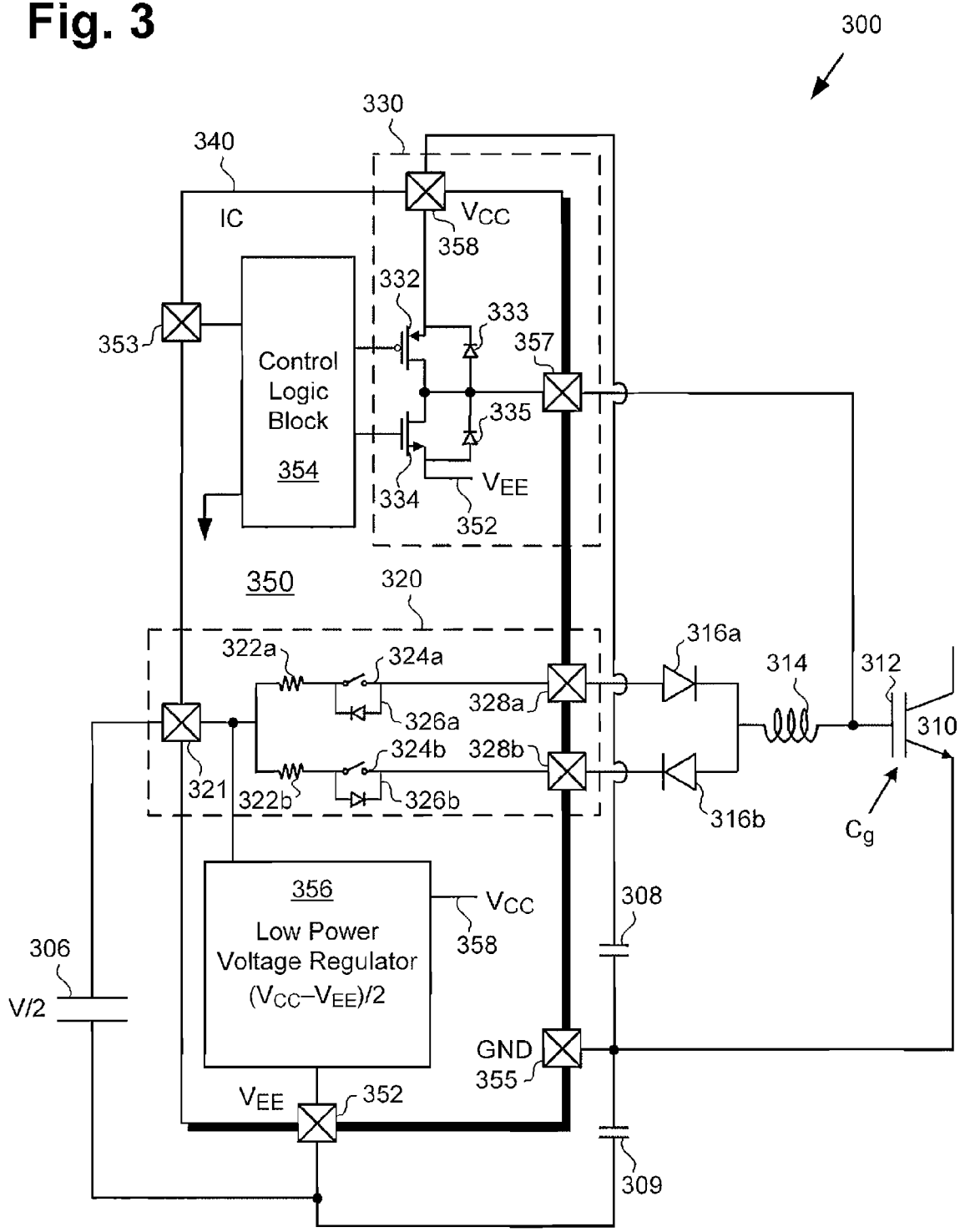
FIG. 3 shows a more detailed diagram of a system including a resonant gate driver, according to one embodiment of the present invention.

Moving now to FIG. 3, FIG. 3 shows a more detailed diagram of system 300 including resonant gate driver 350, according to one embodiment of the present invention. System 300 may be seen to correspond in general to conceptual gate driver arrangement 200, in FIG. 2. As a result, power transistor 310 having gate 312, inductor 314, antiparallel charging/discharging diodes 316a and 316b, and supply capacitor 306 providing voltage V/2, may be seen to correspond respectively to power transistor 210 having gate 212, inductor 214, antiparallel charging/discharging diodes 216a and 216b, and supply capacitor 206 providing voltage V/2, in FIG. 2. However, it is noted that unlike the conceptual arrangement shown in FIG. 2, in the embodiment shown in FIG. 3, supply capacitor 306 is coupled between supply capacitor input/output (I/O) 321 and low voltage rail $V_{EE}$ 352 of resonant gate driver 350. In addition, FIG. 3 depicts an embodiment of resonant gate driver 350 comprising resonant path 320 including switches 324a and 324b, which together correspond to switch 224 in FIG. 2. It is noted that, as in FIG. 2, gate 312 of power transistor 310 is represented as having gate capacitance Cg.

According to the embodiment shown in FIG. 3, resonant gate driver 350 is configured to mediate charge and discharge of gate 312 of power transistor 310 using resonant path 320 to couple gate 312 and supply capacitor 306 through charging/discharging diodes 316a and 316b, and inductor 314. Resonant gate driver 350 is further configured to mediate steady state operation of power transistor 310 by providing low impedance path 330 for coupling gate 314 to a voltage rail of resonant gate driver 350, e.g., $V_{CC}$ 358 or $V_{EE}$ 352, when power transistor 310 is ON or OFF and gate 312 is neither charging nor discharging.

As shown in FIG. 3, in one embodiment, resonant gate driver 350 may be implemented as integrated circuit (IC) 340. According to that embodiment, resonant gate driver circuit 350 includes control logic block 354 coupled to input 353. Although the control mechanism is not fully represented in FIG. 3, control logic block 354 may be configured to selectively utilize resonant path 320 during charge and discharge of gate 312 of power transistor 310. In addition, control logic block 354 may also be configured to selectively control activation of low impedance path 330 and substantially concurrent deactivation of resonant path 320 to coincide with steady state operation of power is transistor 310, thereby advantageously assuring reliable management of the gate voltage of power transistor 310 while power transistor 310 is ON and when power transistor 310 is OFF. As a result, the implementation shown in FIG. 3 enables a significant reduction or substantial elimination of undesirable power dissipation during charge and discharge of gate 312, while also avoiding inadvertent turn-on or turn-off of power transistor 310 during a desired steady state operation.

Resonant path 320 is coupled to supply capacitor 306 through supply capacitor I/O 321, implemented as a connecting pin of IC 340 in the embodiment of FIG. 3. Resonant path 320 includes a charging branch coupling supply capacitor I/O 321 to IC output 328a through switch 324a, as well as a discharging branch coupling IC input 328b to supply capacitor I/O 321 through switch 324b. As shown in FIG. 3, switches 324a and 324b are coupled across respective protection diodes 326a and 326b. As further shown in FIG. 3, switches 324a and 324b are characterized by respective switch resistances 322a and 322b.

Resonant gate driver 350 also includes low power voltage regulator 356 configured to maintain supply capacitor 306 at half of the supply voltage of resonant gate driver 350, e.g., $(V_{CC}-V_{EE})/2$, which may also be characterized simply as V/2. Also shown in FIG. 3 are ground pin 355 of IC 340, which couples power transistor 310 at its source, and blocking capacitors 308 and 309 externally coupled between ground pin 355 and the respective $V_{CC}$ 358 and $V_{EE}$ 352 supplies to IC 340.

As previously mentioned, low impedance path 330 is utilized by resonant gate driver 350 during steady state operation of power transistor 310, that is to say, when power transistor 310 is either ON or OFF and gate 312 is neither charging nor discharging. According to the embodiment shown in FIG. 3, low impedance path 330 is configured to selectively couple gate 312 of power transistor 310 to one of voltage rails $V_{CC}$ 358 and $V_{EE}$ 352 through IC pin 357 and respective low impedance transistors 332 and 334 including body diodes 333 and 335, respectively.

The operation of resonant gate driver 350 will now be described in greater detail in combination with a discussion of FIG. 4, which presents flowchart 400 of a method for use by a resonant gate driver, such as resonant gate driver 350, in FIG. 3, for driving a power transistor, such as power transistor 310, according to one embodiment of the present invention. Certain details and features have been left out of flowchart 400, in FIG. 4, that are apparent to a person of ordinary skill in the art. For example, a step may comprise one or more substeps or may involve specialized equipment or materials, as known in the art. While steps 410 through 440 indicated in flowchart 400 are sufficient to describe one embodiment of the present invention, other embodiments of the invention may utilize steps different from those shown in flowchart 400, or may comprise more, or fewer, steps.

Figure 4:
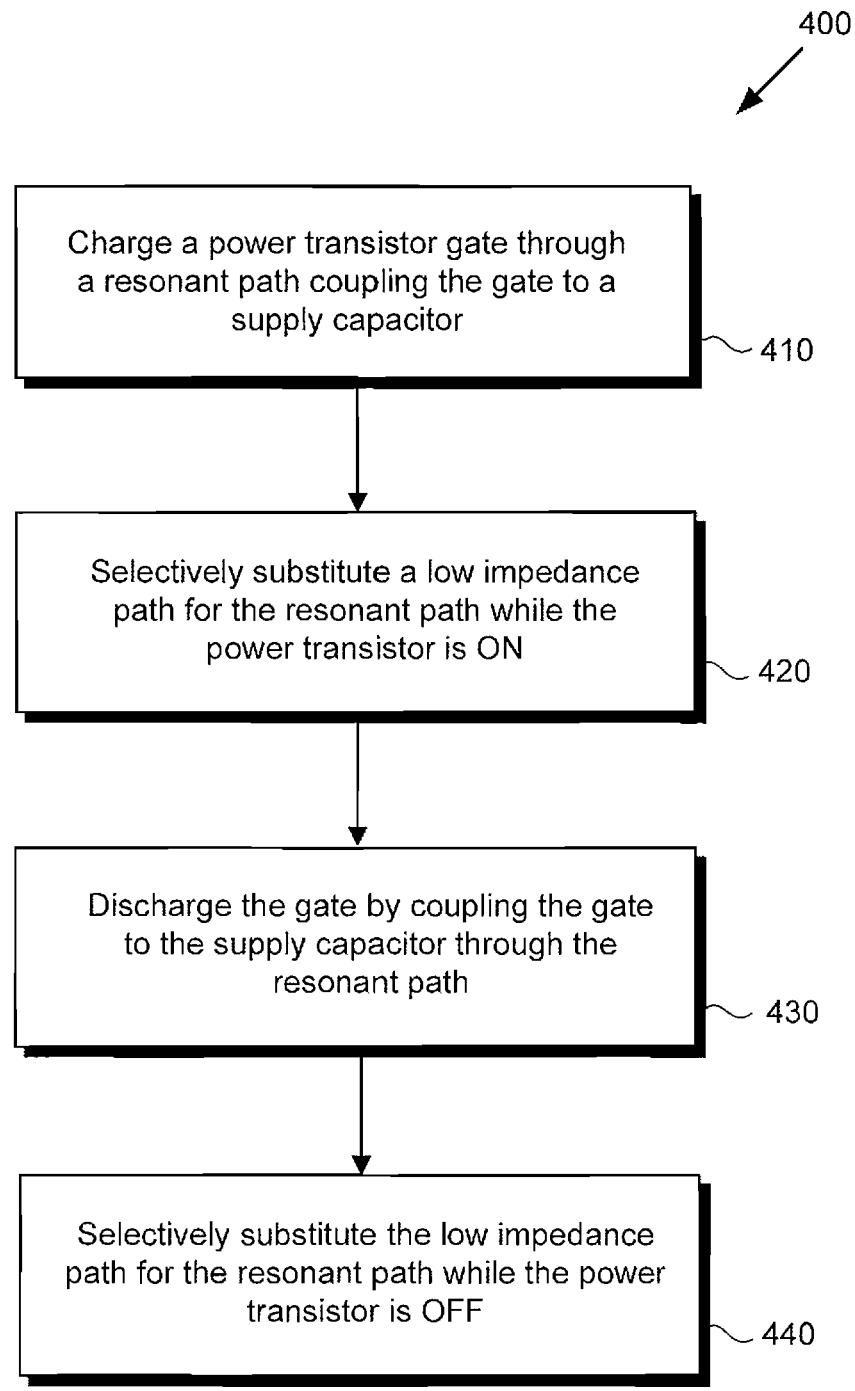
FIG. 4 is a flowchart of a method for use by a resonant gate driver for driving a power transistor, according to one embodiment of the present invention.

Referring to step 410 in FIG. 4 and system 300 in FIG. 3, step 410 of to flowchart 400 comprises charging gate 312 of power transistor 310 through resonant path 320 coupling gate 312 to supply capacitor 306. By way of providing specific exemplary values for the components of system 300, supply capacitor 306 may comprise a 10 μF capacitor, for example, while the gate capacitance $C_g$ of power transistor 310 may have a value of approximately 250 nF. Moreover, switch resistances 322a and 322b may be approximately 200 mΩ, for example. As shown in FIG. 3, resonant path 320 couples gate 312 to supply capacitor 306 using inductor 314, which in the present specific example may be represented as having a value of approximately 2 for instance.

Step 410 may correspond to closure of switch 324a by control logic block 354 of resonant gate driver 350 in response to an input signal received at input 353, while switch 324b is kept open and low impedance transistors 332 and 334 are both OFF. Closure of switch 324a connecting supply capacitor 306 to gate 312 through charging diode 316a and inductor 314 gives rise to resonant oscillations, resulting in a charging current flowing through resonant path 320 so as to transfer charge from supply capacitor 306 to the gate capacitance $C_g$ of gate 312. The nature of the resonance phenomenon enables use of supply capacitor 306 to charge gate 312 to approximately twice the voltage stored on supply capacitor 306. That is to say, supply capacitor 306 providing voltage V/2, e.g., $(V_{CC}-V_{EE})/2$, can be utilized to charge gate 312 to a voltage value of approximately V.

Continuing with step 420 in FIG. 4 and with continued reference to system 300 in FIG. 3, step 420 of flowchart 400 comprises selectively substituting low impedance path 330 for resonant path 330 while power transistor 310 is ON. Step 420 may be performed by control logic block 354 of resonant gate driver 350 after a delay interval corresponding to a predetermined charging period of gate 312, for example. Control logic block 354 may perform step 420 by opening switch 324a while keeping switch 324b open as well, and turning ON low impedance transistor 332 but keeping low impedance transistor 334 OFF. Low impedance transistor 332, which is shown as a PFET in FIG. 3, may present an on-resistance of approximately 5 Ω, for example, is providing a low impedance path coupling gate 312 to voltage rail $V_{CC}$ 358 while power transistor 310 is ON, thereby advantageously clamping the voltage at gate 312 to approximately $V_{CC}$ during steady state ON operation of power transistor 310.

Moving to step 430 in FIG. 4 and continuing to refer to system 300 in FIG. 3, step 430 of flowchart 400 comprises discharging gate 312 of power transistor 310 through resonant path 320. Step 430 may be performed by control logic block 354 of resonant gate driver 350, and may comprise turning low impedance transistor 332 OFF and closing switch 324b, again in response to an input signal received at input 353, while switch 324a is kept open and low impedance transistor 334 is kept OFF. Turning low impedance transistor 332 OFF and closing switch 324b connects gate 312 to supply capacitor 306 through inductor 314 and discharging diode 316b, resulting in a discharging current flowing through resonant path 320 so as to transfer charge from gate capacitance $C_g$ of gate 312 back to supply capacitor 306, from which it was drawn in step 410.

Referring now to step 440 in FIG. 4, step 440 of flowchart 400 comprises selectively substituting low impedance path 330 for resonant path 320 while power transistor 310 is OFF. Once again, step 440 may be performed by control logic block 354 of resonant gate driver 350 after a delay interval corresponding to a predetermined discharging period of gate 312, for example. Control logic block 354 may perform step 440 by opening switch 324b while keeping switch 324a open as well, and turning ON low impedance transistor 334 but keeping low impedance transistor 332 OFF. Low impedance transistor 334, which is shown as an NFET in FIG. 3, may present an on resistance of approximately 5 Ω, for example, providing a low impedance path coupling gate 312 to voltage rail $V_{EE}$ 352 while power transistor 310 is OFF, thereby advantageously clamping the voltage at gate 312 to approximately $V_{EE}$ during steady state OFF operation of power transistor 310.

It is noted that due to the selective substitution of low impedance path 330 for resonant path 320 during steady state operation of power transistor 310, substantially no current flows through resonant path 320 when gate 312 is neither charging nor discharging. Consequently, embodiments of the present invention advantageously restrict even the low power dissipation produced by resonant path 320 to those limited intervals during which gate 312 is either charging or discharging. Furthermore, the relatively large capacitance of supply capacitor 306 compared to gate capacitance $C_g$ assures that the voltage V/2 on supply capacitor 306 remains substantially stable during charge step 410 and discharge step 430. As a result, resonant gate driver 350 can advantageously be implemented using low power voltage regulator 356 to reliably maintain the voltage on supply capacitor 306 at V/2.

Figure 5:
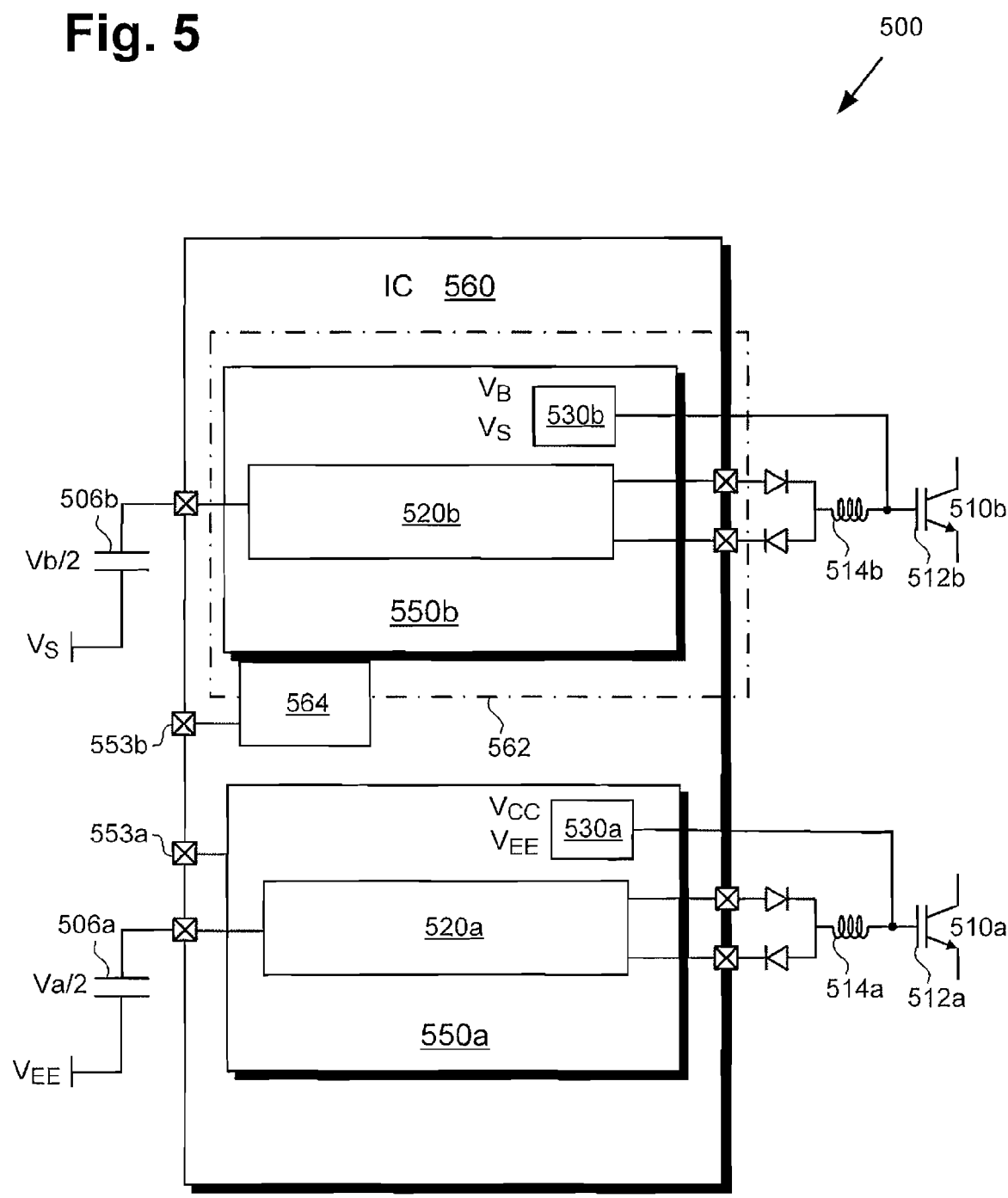
FIG. 5 shows a block diagram of a system including first and second resonant gate drivers for driving respective power transistors implemented as low side and high side switches, according to one embodiment of the present invention.

Turning to FIG. 5, FIG. 5 shows a block diagram of a system including first and second resonant gate drivers for driving respective power transistors implemented as low side and high side switches, according to one embodiment of the present invention. System 500 comprises resonant gate driver IC 560 configured to drive low side power transistor switch 510a and high side power transistor switch 510b using respective resonant gate drivers 550a and 550b. Resonant gate driver 550a is shown in FIG. 5 to include resonant path 520a capable of coupling gate 512a of power transistor 510a to supply capacitor 506a through inductor 514a during a charge or discharge process, and low impedance path 530a for coupling gate 512a to one of voltage rails $V_{CC}$ and $V_{EE}$ during steady state ON and OFF operation, respectively. Supply capacitor 506a, resonant gate driver 550a including resonant path 520a and, low impedance path 530a and supplied by voltage rails $V_{CC}$ and $V_{EE}$, inductor 514a, and power transistor 510a including gate 512a correspond respectively to supply capacitor 306, resonant gate driver 350 including resonant path 320 and low impedance path 330 and supplied by voltage rails $V_{CC}$ 358 and $V_{EE}$ 352, inductor 314, and power transistor 310 including gate 312, in FIG. 3. Also shown in FIG. 5 is input 553a corresponding to input 353 in FIG. 3.

As further shown by FIG. 5, embodiments of the present resonant gate driver may be adapted for use in driving a high side switch as well. According to the embodiment of FIG. 5, resonant gate driver IC 560 comprises a high voltage region 562 wherein high side resonant gate driver 550b is implemented. Inputs to resonant gate driver IC 560 at input 553b may be level shifted up by level shift circuit 564. When suitably adapted as a high side resonant gate driver, resonant gate driver 550b is configured to utilize resonant path 520b to couple gate 512b of power transistor 510b to supply capacitor 506b through inductor 514b during a charge or discharge process, and to selectively utilize low impedance path 530b for coupling gate 512b to one of voltage rails $V_B$ and $V_S$ during steady state ON and OFF operation, respectively, wherein voltage Vb/2 corresponds to approximately fifty percent of the rail to rail voltage of resonant gate driver 550b, e.g., $Vb/2 \approx (V_B - V_S)/2$.

Thus, by providing a resonant path during charge and discharge of a power transistor gate capacitance, embodiments of the resonant gate driver disclosed herein advantageously enable a significant reduction or substantial elimination of undesirable power dissipation during the gate charge and discharge process. In addition, by preventing current flow through the resonant path during steady state operation of the power transistor, embodiments of the present invention prevent power dissipation by the resonant path while the power transistor is ON and OFF. Moreover, by selectively substituting a low impedance path for coupling the power transistor gate to a voltage rail when the gate is neither charging nor discharging, embodiments of the present invention advantageously assure reliable management of the gate voltage while the power transistor is ON and OFF. As a result, embodiments of the present invention can enable substantial lossless charging and discharging of the power transistor gate while also avoiding inadvertent turn-on or turn-off of the power transistor during its desired steady state operation.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A resonant gate driver comprising:
   a resonant path configured to couple a gate of a power transistor to a supply capacitor;
   a low impedance path configured to couple said gate of said power transistor to a voltage rail;
   said resonant gate driver selectively utilizing said resonant path during charging and discharging of said gate of said power transistor, and selectively utilizing said low impedance path to couple said gate of said power transistor to said voltage rail when said gate of said power transistor is neither charging nor discharging.

2. The resonant gate driver of claim 1, wherein substantially no current flows through said resonant path when said gate of said power transistor is neither charging nor discharging.

3. The resonant gate driver of claim 1, wherein said supply capacitor is charged to approximately fifty percent (50%) of a rail to rail voltage of said resonant gate driver.

4. The resonant gate driver of claim 1, wherein selectively utilizing said resonant path during charging and discharging of said gate of said power transistor results in substantially reduced power loss from said charging and discharging.

5. The resonant gate driver of claim 1, further comprising a low power voltage regulator for regulating a voltage of said supply capacitor.

6. The resonant gate driver of claim 1, wherein said resonant gate driver is implemented as an integrated circuit (IC).

7. The resonant gate driver of claim 1, wherein said power transistor is utilized as a low side switch or a high side switch.

8. A method for use by a resonant gate driver for driving a power transistor, said method comprising:
   charging and discharging a gate of said power transistor by selectively coupling said gate of said power transistor to a supply capacitor through a resonant path;
   utilizing a low impedance path to selectively couple said gate of said power transistor to a voltage rail when said gate of said power transistor is neither charging nor discharging.

9. The method of claim 8, wherein substantially no current flows through said resonant path when said gate of said power transistor is neither charging nor discharging.

10. The method of claim 8, wherein said supply capacitor is charged to approximately fifty percent (50%) of a rail to rail voltage of said resonant gate driver.

11. The method of claim 8, wherein said method results in substantially reduced power loss from said charging and discharging.

12. The method of claim 8, further comprising regulating a voltage of said supply capacitor using a low power voltage regulator.

13. The method of claim 8, further comprising implementing said resonant gate driver as an integrated circuit (IC).

14. The method of claim 8, wherein said resonant gate driver and another resonant gate driver are implemented on said IC, said method also used by said another resonant gate driver for driving another power transistor.

15. The method of claim 14, wherein said power transistor and said another power transistor are implemented as respective low and high side switches.

* * * * *